United States Patent [19]

Blum et al.

[11] Patent Number: 5,164,818
[45] Date of Patent: Nov. 17, 1992

[54] REMOVABLE VLSI ASSEMBLY

[75] Inventors: Arnold Blum, Gechingen; Frank Gerth, Tübingen; Manfred Perske, Sindelfingen; Manfred Schmidt, Schönaich, all of Fed. Rep. of Germany

[73] Assignee: International Business Machines Corporation, Armonk, N.Y.

[21] Appl. No.: 765,072

[22] Filed: Sep. 24, 1991

[30] Foreign Application Priority Data

Nov. 2, 1990 [EP] European Pat. Off. ........ 90120994.0

[51] Int. Cl.⁵ ............................................. H01L 23/02
[52] U.S. Cl. .................................... 257/778; 361/400; 257/697; 257/772
[58] Field of Search ............... 361/413, 189, 405, 400; 357/74, 75, 80, 68

[56] References Cited

U.S. PATENT DOCUMENTS

| | | | |
|---|---|---|---|
| 2,958,064 | 10/1960 | Swengel | 361/413 |
| 4,885,126 | 12/1989 | Polonio | 361/189 |
| 5,036,163 | 7/1991 | Spielberger | 357/74 |

Primary Examiner—William Mintel
Assistant Examiner—Roy Potter
Attorney, Agent, or Firm—Francis J. Thornton

[57] ABSTRACT

A system for mounting VLSI devices on a substrate is disclosed, offering a high contact density. Each package consists of a semiconductor device having protruding elongated contact pin (2) on its surface and a wiring substrate having a cavity (3) on its surface. The cavities are filed with a conductive material (7) of a low melting point composition and sealed with a thin non-conductive foil (4). During packaging, the contact pins are made to penetrate the foil, and extend into the conductive alloy, thus making electrical contact therewith. To ease the penetration of the foil, the contact pins could be set into oscillating motion by means of an ultrasonic generator.

12 Claims, 1 Drawing Sheet

REMOVABLE VLSI ASSEMBLY

DESCRIPTION

The present invention relates to assembly techniques for VLSI semiconductor devices and more particularly to an assembly having a high contact density and which can be readily disassembled.

In modern VLSI packages there is provided a semiconductor chip and a wiring substrate for connecting the chip to the external systems. Each integrated circuit carries a plurality of I/O contacts for data transfer, control and timing signals and voltages. With ongoing development and higher circuit density the number of necessary contacts per chip increases. In many cases this increased complexity is combined with reduced chip dimensions. Consequently the total area available for interconnections, between the chip and the wiring substrate, is reduced, further crowding the contact pads and leading to increased temperature stresses, between duty and standby or power-off cycles and higher probability of thermomechanically caused damage to the interconnections.

If defects are found, when the interconnected unit is tested, rework of the unit is necessary, including disassembly, surface cleaning, preparation of contact pads and new bonding.

There are different fabrication techniques for assembling semiconductor devices. Cost and/or performance considerations usually dictate the assembly and packaging details. Most commonly used besides soldering techniques such as the Controlled Collapse Chip Connection (C4) are wire-bonding techniques, i.e. Ultrasonic (U/S), Thermocompression (T/C) and Thermosonic (T/S) Bonding, and the Tape Automated Bonding (TAB).

In the C4 technique pads on the device carry solder balls which are melted during an assembly reflow process and thus soldered to the respective contact area of the wiring substrate. For high density devices these solder ball contacts can be arranged efficiently, e.g. in a square grid array, resulting in the desired amount of interconnections.

If rework is required, C4 soldered devices must be reheated to melt the solder. In this case the residual amounts of solder that remain on all contact areas must be removed prior to joining a new device to the old substrate.

Wire bonding is basically a perimeter lead technique and because of the mechanical aspects of the wire contacts, minimum spacings between the pads are required. Thereby limiting the number of contacts available. In most cases, for VLSI devices designed for high-density, large-number interconnections the available number of contacts is insufficient.

Tape automated bonding limitations in the number of contacts that can be bonded. If multi-layer tapes are used to enhance the number of contacts, other problems occur, e.g. warpage of the structure caused by cure-shrinkage of the films. Also, rework of tape bonded devices is not practical due to residual material of the tape and remaining contact metal.

The present invention is intended to remedy these drawbacks.

It it thus an object of the invention to disclose an assembly system suitable for high density interconnections.

It is another object of the invention to disclose a system for high density interconnection which can easily be assembled and disassembled.

It is still another object of the invention to disclose an assembly showing high resistance against temperature cycle stresses, thus enhancing the stability and lifetime of the assembly.

In the present invention a new type of packaging structure is disclosed, wherein the interconnection between a semiconductor device and a wiring substrate combines the features of being easily assembled and disassembled and being suitable for VLSI devices carrying high density contact arrays. This is achieved through a substrate provided with cavities filled with a conductive liquid or a low melting alloy and sealed with a thin nonconducting film or foil and adapted to mate with a device having extending pins. During packaging process the tips of the pins penetrate through the foil, thus protruding into the conductive liquid or melted alloy.

For a better understanding of the present invention together with further objects and advantages, a preferred embodiment of the invention is described in the following with reference to the accompanying drawings, in which.

Figure 1:
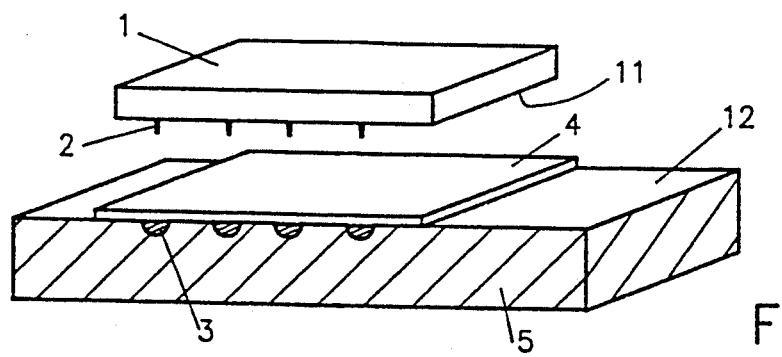
FIG. 1 shows a device carrying connector pins and a substrate having the respective cavities filled with a conducting material and sealed with a thin nonconducting foil.
Figure 2:
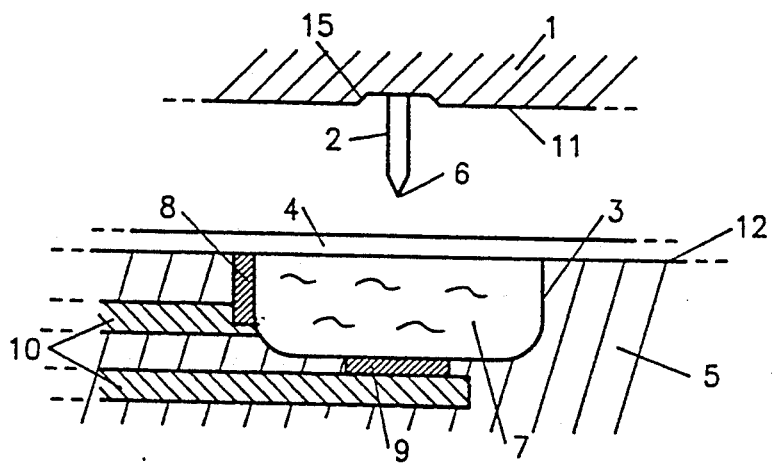
FIG. 2 illustrates the respective parts of one interconnection prior to assembly.
Figure 3:
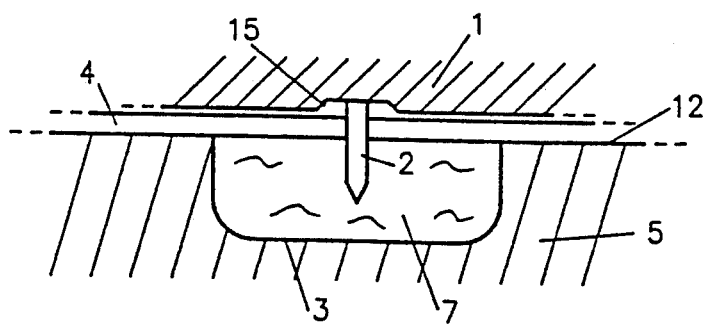
FIG. 3 is a detail view of one interconnection after the device has been assembled.
Figure 4:
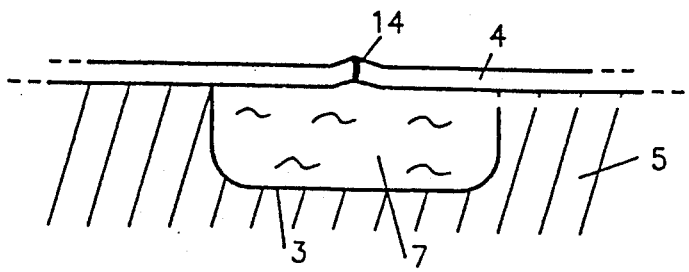
FIG. 4 shows the 'self-healing' effect of the penetrated foil after the device has been removed.

In a preferred embodiment of the invention the contacting surface (11) of an electronic device (1) carries a plurality of pins (2), extending from said contacting surface (11). These pins (2) are conductive and connected to the signal, power supply and all other desired I/O lines of the device. Suitable metals and metal alloys are e.g. tungsten, tungsten carbide or copper beryllium but other materials that provide sufficient mechanical stability and minimum current losses could be used. The contact pins (2) can be separately applied or formed by a suitable process such as deposition etching. Due to the different ways of processing the slope of the pins can vary. To ease penetrating through the foil (4) during assembly, the tips of the pins (6) can be tapered, e.g. by etching. In the preferred embodiment of the invention the pins (2) have a mean diameter of about 30 micron and the tip diameter is of about 5 micron, although other values would be suitable. Around the base region of the pins the contact surface (11) of the device (1) is recessed (15) thus providing space for thermal expansion of the conducting material (7) in the cavities (3) after the device was assembled.

On the surface (12) of the substrate (5) there are holes or cavities (3), which are filled with a conducting material (7) and sealed by a non-conductive foil (4). These cavities can be produced by standard etching processes as known by those skilled in the semiconductor art. The form of the holes or cavities can vary due to the chosen preparation technique, e.g. anisotropical etching might produce a rather flat bottom with steep sidewalls, whereas wet etching will result in a more rounded shape. If the substrate (5) consists of a crystalline material also crystallographically oriented etching is appropriate, creating cavities having pyramidal forms. The depth of the cavities is at least a bit more than the space needed for the protruding end of the matching pin after assembly. On the bottom and/or at least on parts of the sidewalls of the cavities are conducting lands or pads (8,9) providing electrical contact with the respective wiring lines (10) of the substrate (5). These lands are exposed to the conducting material (7), which thus has the same electrical potential. In the preferred embodiment of the invention the cavity-filling substance (7) consists of a metal or metal alloy having a low melting point, e.g. mercury or eutectic alloys of one or more of metals such as aluminum, bismuth, cadmium, indium, lead, tin, and/or zinc—known as WOOD alloys, although other materials such as standard solders might be suitable for special applications. The cavity (3) contains the conducting material up to a level next to the surface (12) of the substrate (5). The foil (4) is then deposited onto the whole or only on parts of the substrate surface, so that each cavity and the material therein is hermetically sealed. By this coverage on the one hand corrosion or contamination of the conducting material is prevented on the other hand the conducting material is striped off from the contact pins (2) during detraction for disassembly of the device. The foil consists of an insulating, elastic substance, e.g. a material such as polyester or polyvinylchloride is preferred, although other nonconducting and flexible materials can be used.

In the present embodiment the thickness of the foil preferably is equal to or greater than the diameter of the pin (2) during assembly, e.g. for a pin diameter of about 30 micron the foil should have a thickness not less than 30 micron. Due to the elasticity of the foil this ratio will provide a 'self- healing' effect (14) of the foil if the device is disassembled. Of course foil materials thinner than the pin diameter can be used.

During assembly the device (1) is positioned above the substrate (5), so that the corresponding pins (2) and cavities (3) are aligned. The diameter of the cavities at the substrate surface (12) is preferably several times the diameter of the matching contact pin. This allows a wide range of misalignment between the cavities and the pins. The substrate is hold at a temperature at which the conducting material (7) is liquid. The interconnection between device (1) and wiring substrate (5) is then performed by pressing both parts together, whereby the contact pins or needles (2) pass through the foil (4) into the conducting material (7) thus making electrical contact therewith.

The penetration of the contact pins through the foil can be eased by means of ultrasonic vibrations. generated by at an ultrasonic source, (not shown) in contact with the substrate.

If rework is necessary the device (1) can be easily disassembled. For this the substrate (5) brought to a temperature sufficient to soften the conducting material (7) in said cavities. Then the device retracted from the substrate and replaced with a new device. Due to the 'self-healing' effect of the covering foil (4), the conducting material remains sufficiently sealed, so that no further process steps like cleaning or preparing of contact means are required.

Accordingly, this self healing effect of the foil and also serves to wipe the pins as they are removed.

One of the advantages of the present invention is the stability of the disclosed package against thermostresses. The conducting material (7) can be selected to have a melting point below the operating temperature of the device. As all interconnections are made by the pins penetrating through a flexible foil protruding partly into a liquid conducting material, the respective parts of the interconnection remain movable and can be dislocated in small amounts due to differences in the thermal expansion of the package. Thermal expansion of the conducting material (7) is tolerated because of the free space left by a recess (15) around the base of the pins (2). This results in the desired immunity against stresses caused by thermocycles occurring during operation. The same effect can be reached in the case where the conductive material (7) is not liquid during normal operating conditions. If the contact pins (2) are chosen from materials which posses sufficient mechanical elasticity, this part of the interconnection will follow thermal expansion forces by bending. Damaging of the device or substrate caused by thermally stressed interconnections is thus avoided or significantly reduced.

Although the preferred embodiment of the invention has been described having the contact pins (2) located on the surface (11) of the device (1) and the cavities (3) positioned on the surface (12) of the wiring substrate (5), it is understood that the corresponding counterparts of the interconnections can be placed vice versa, i.e. the contact pins provided on the surface of the substrate and the cavities on the surface of the device respectively.

What is claimed is:

1. A semiconductor package comprising a semiconductor device having a major surface;
    a plurality of elongated means located on the surface of said device extending perpendicular to said major surface, and
    a substrate having a major surface and a a plurality of cavities on the major surface of said substrate, each cavity of said plurality of cavities, located with respect to the corresponding position of one of said plurality of elongated means on said device,
    a conductive metal having a melting temperature no greater than wood alloy melting temperatures in each of said cavities; and
    a nonconductive foil covering each of said cavities and said conductive metal,
    said elongated means penetrating said foil and establishing electrical contact between said conductive metal and said elongated means.

2. The package according to claim 1, wherein said elongated means are tapered contact pins.

3. The package according to claim 1, wherein said elongated means are formed of a material selected from the group comprising tungsten, tungsten-carbide, copper-beryllium, and doped silicon.

4. The package according to claim 1, wherein said elongated means are formed by etching said major surface of said device.

5. The package according to claim 1, wherein said elongated means is about 30 microns in diameter and having a tip sharpened to about 5 microns.

6. The package according to claim 1, wherein said cavities are connected to wiring on said substrate.

7. The package according to claim 1, wherein said conductive metal consists of a material selected from the group comprising the wood alloys and mercury.

8. The package according to claim 1, wherein said foil has a thickness equal to or less than the diameter of the elongated means.

9. The package according to claim 1, wherein said foil consists of a non-conductive elastic material.

10. The package according to claim 1, wherein said cavity has a surface width several times the diameter of the elongated means.

11. The package according to claim 1, wherein a region around said elongated means is recessed with respect to the major surface of the device.

12. The package according to claim 1, wherein said wiring substrate consists of a material selected from the group comprising ceramic and silicon.

* * * * *